United States Patent [19]
Yang et al.

[11] Patent Number: 6,024,106
[45] Date of Patent: Feb. 15, 2000

[54] POST-CMP WAFER CLEAN PROCESS

[75] Inventors: Ming-Sheng Yang; Juan-Yuan Wu, both of Hsinchu; Water Lur, Taipei, all of Taiwan

[73] Assignee: United Microelectronics Corp., Taipei, Taiwan

[21] Appl. No.: 09/195,794

[22] Filed: Nov. 19, 1998

[51] Int. Cl.[7] .............................. B08B 6/00; C11D 9/04
[52] U.S. Cl. ............................. 134/1.3; 510/175; 510/176
[58] Field of Search .......................... 134/1.3; 510/175, 510/176

[56] References Cited

U.S. PATENT DOCUMENTS

| | | | |
|---|---|---|---|
| 5,143,103 | 9/1992 | Basso et al. | 134/38 |
| 5,355,048 | 10/1994 | Estes | 310/334 |
| 5,496,491 | 3/1996 | Ward et al. | 252/153 |
| 5,556,482 | 9/1996 | Ward et al. | 134/38 |
| 5,563,119 | 10/1996 | Ward | 51/176 |
| 5,597,420 | 1/1997 | Ward | 134/38 |
| 5,707,947 | 1/1998 | Ward et al. | 510/176 |
| 5,735,963 | 4/1998 | Obeng | 134/3 |
| 5,759,973 | 6/1998 | Honda et al. | 510/176 |
| 5,762,084 | 6/1998 | Krussell et al. | 134/184 |
| 5,780,406 | 7/1998 | Honda et al. | 510/175 |
| 5,858,106 | 1/1999 | Ohmi et al. | 134/1 |
| 5,872,046 | 2/1999 | Kaeriyama et al. | 438/465 |
| 5,911,835 | 6/1999 | Lee et al. | 134/1.3 |

Primary Examiner—Randy Gulakowski
Assistant Examiner—Yolanda E. Wilkins
Attorney, Agent, or Firm—Thomas, Kayden, Horstemeyer & Risley

[57] ABSTRACT

A post-CMP wafer clean process. A post-CMP wafer is provided. A portion of particles and slurry are removed from the wafer by double side scrubber. The residual particles and slurry are then removed from the wafer in a solvent tank by magasonic and a solvent in the solvent tank includes an amine-based compound.

13 Claims, 6 Drawing Sheets

POST-CMP WAFER CLEAN PROCESS

BACKGROUND OF THE INVENTION

1. Field of the Invention

The invention relates to a post-CMP wafer clean process, and more particularly to a post CMP wafer clean process to remove particles and slurry from a loafer by a solvent tank with megasonic.

2. Description of the Related Art

Planarization is an important technology in semiconductor process. The surface of the wafer has an even topography during planarization and it is able to prevent from scattering of exposure light source, so that the pattern transfer can be carried out exactly. Planarization technology mainly includes two methods of spin-on glass (SOG) and chemical mechanical polishing (CMP). However, SOG can not satisfy gradually the requirement of planarization as the semiconductor technique enters the field of sub-half-micron. CMP is the only process currently that can provide global planarization in very-large scale integration (VLSI) and ultra-large scale integration (ULSI). CMP in prior art has been used on planarization of shallow trench isolation (STI), inter-layer dielectric (ILD) and inter-metal dielectric (IMD).

CMP is a planarization process to planarize an uneven topography surface by applying mechanical polishing and adding suitable chemical reagent and slurry. When conditional parameters of process can be controlled definitely, 94% even surface can be obtained by CMP. Regarding the post-CMP cleaning processes of the wafer, it includes brush cleaning and spay cleaning to remove the slurry left on the wafer.

FIGS. 1A–1D are illustrating fabrication of metal interconnect in prior art. Referring to FIG. 1A, a dielectric layer 12 having an opening 14, such as contact window or via hole, is formed on a substrate or a conductive layer 10.

Referring to FIG. 1B, a conformal barrier layer 16 including titanium/titanium nitride (Ti/TiN) or titanium nitride (TiN) is formed on the dielectric layer 12. The barrier layer 16 is used to prevent from direct contact of plug in subsequent process and the substrate/conductive layer 10, and also enhance adhesion between the plug, the substrate/conductive layer 10 and the dielectric layer 12. A metal layer 18 such as tungsten is deposited on the barrier layer 16. Since an overhang structure 16a is formed while forming the barrier layer 16, the metal layer 18 can not fill in the opening 14 of FIG. 1A completely and result in a key hole 20 within the metal layer 18.

Referring to FIG. 1C, using the dielectric layer 12 as a stop layer, a portion of the metal layer 18 and barrier layer 16 are removed and the key hole 20 is exposed to result in a dint 20a formed within the metal plug 18a of FIG. 1C. During the step of CMP, slurry 22 and particles are therefore left on the dielectric layer 12 and the dint 20a such that a material layer in subsequent process can not be adhered thereon due to the slurry 22 and particles absorbing moisture easily. The moisture becomes vapor to form a bubble, which is called outgassing, within these layers through a high temperature process of depositing a metal layer subsequently. Outgassing causes the problem of poison via plug and contact plug.

Referring FIG. 1D, the particles and slurry 22 on the dielectric layer 12 are removed. The post-CMP clean process is typically shown in a flow chart of FIG. 2. The process starts from double side scrubber (DSS) 210 after providing a post-CMP wafer 200, and the post-CMP wafer clean process is achieved 220. It is well known to use DSS with ammonium hydroxide ($NH_4OH$) and dilute fluoride hydrogen (HF) to remove the slurry residue. However, it is hard for DSS to clean the slurry left on the dint 20a completely. The residual particles and slurry 22 absorb moisture easily during the post-CMP process and the moisture becomes vapor under a high temperature to cause a bubble formed within. The existence of the bubble may cause crack of the conductive layer and short is thus occurred to influence the operation of the device.

SUMMARY OF THE INVENTION

It is therefore an object of the invention to provide a post-CMP wafer clean process to remove particles and slurry left in the dint to prevent from the formation of the bubble, and the performance of device can be enhanced.

To achieve these objects and advantages, and in accordance with the purpose of the invention, as embodied and broadly described herein, the invention is directed towards a post-CMP wafer clean process. A post-CMP wafer is provided. A portion of particles and slurry are removed from the wafer by double side scrubber. The residual particles and slurry are removed from the wafer in a solvent tank by megasonic and a solvent in the solvent tank includes an amine-based compound.

It is to be understood that both the foregoing general description and the following detailed description are exemplary and explanatory only and are not restrictive of the invention, as claimed.

DESCRIPTION OF THE PREFERRED EMBODIMENTS

Figure 1A:
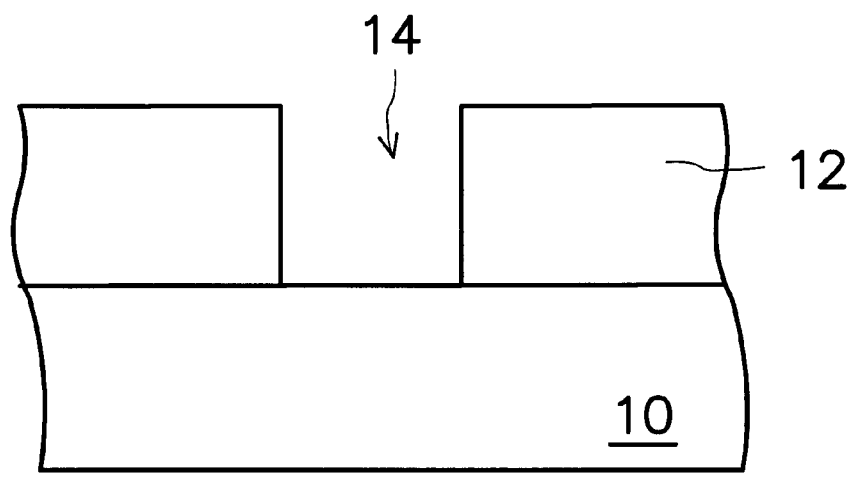
FIGS. 1A–1D are cross sectional view illustrating fabrication of interconnect as known in prior art.
Figure 1B:
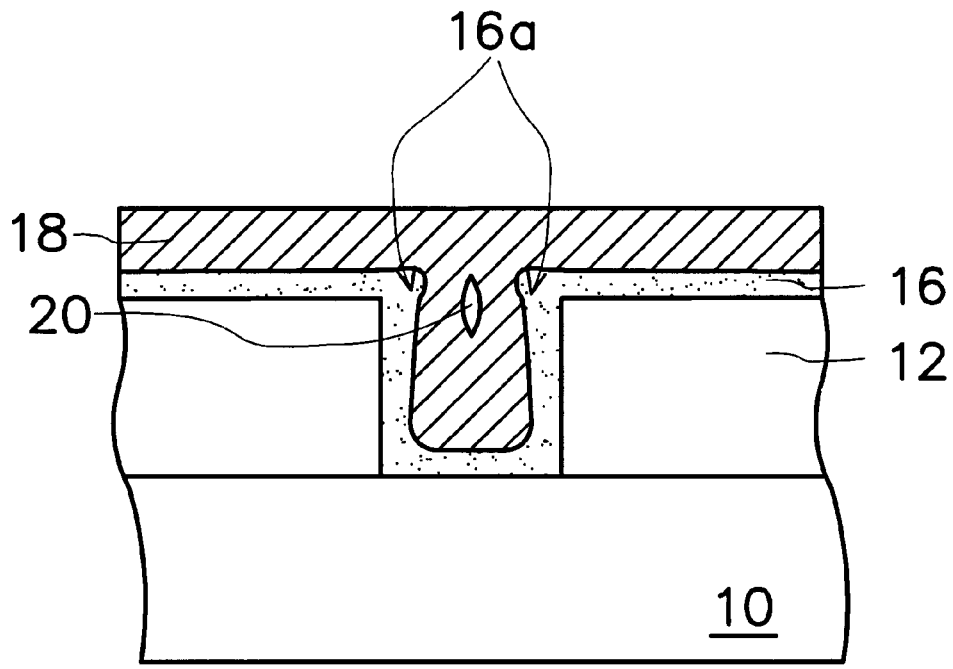
Figure 1C:
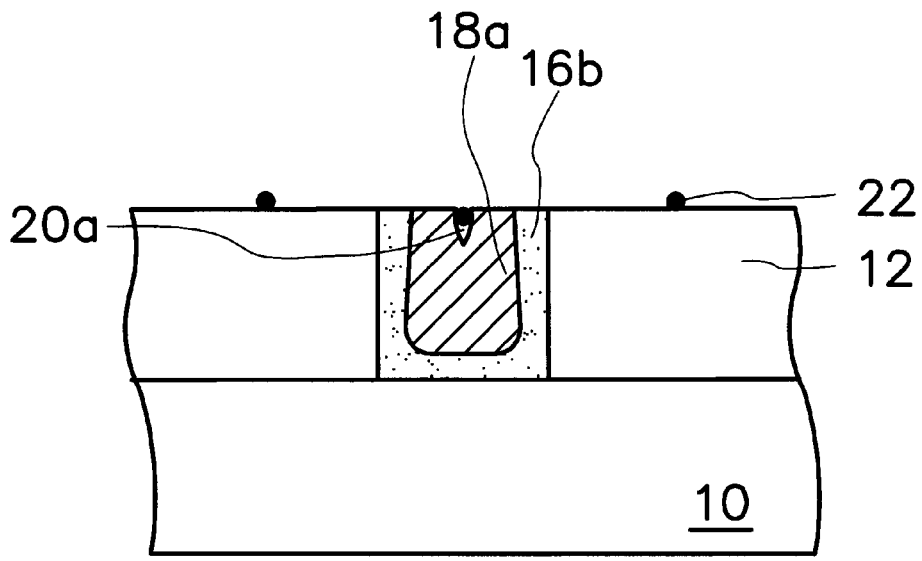
Figure 1D:
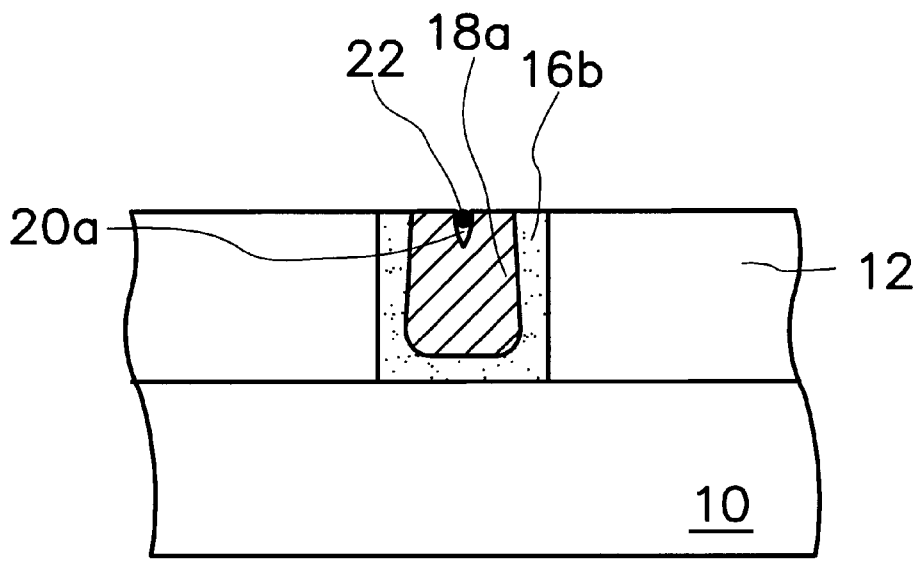
Figure 2:
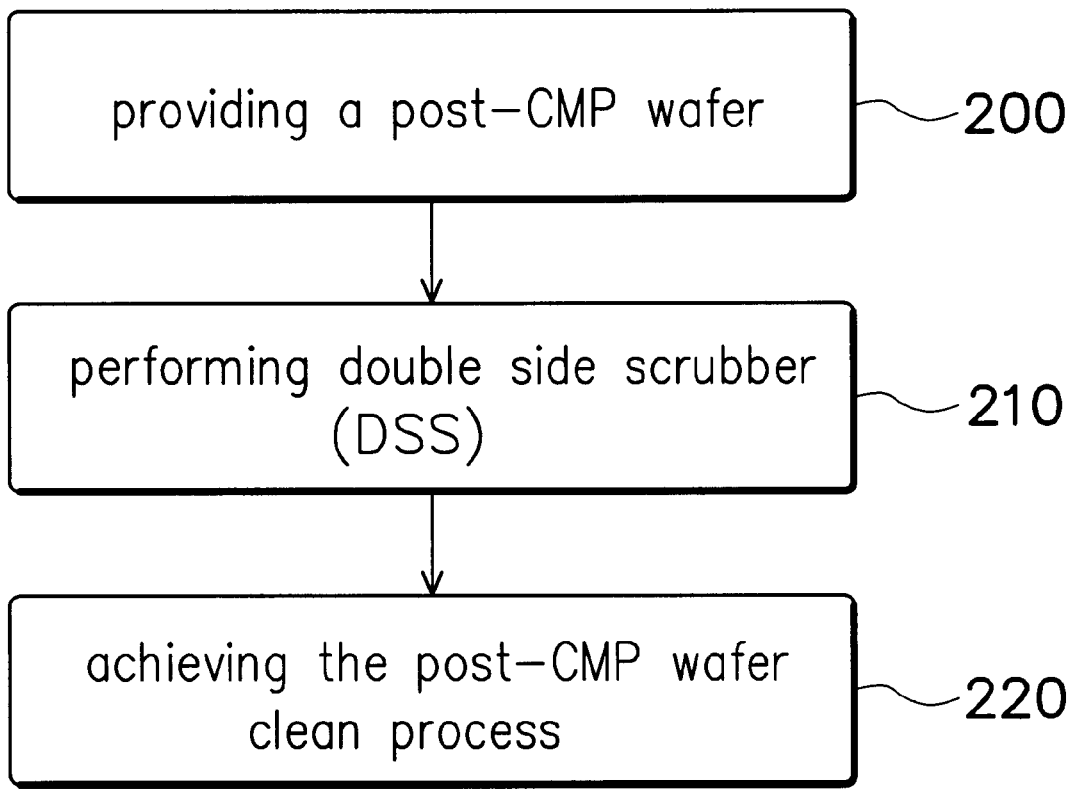
FIG. 2 is a flow chart of post-CMP clean process known in prior art.
Figure 3A:
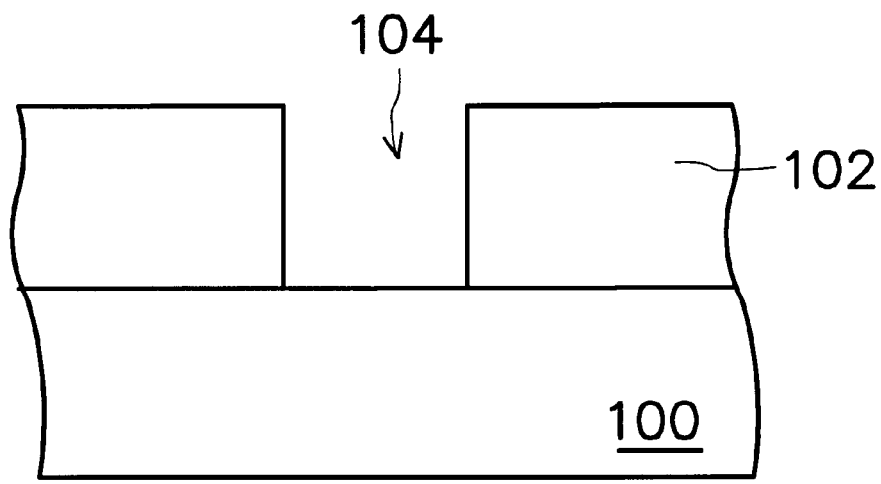
FIGS. 3A–3D are cross sectional view illustrating fabrication of interconnect in a preferred embodiment according to the invention.

Referring to FIG. 3A, a dielectric layer 102 having an opening 104 is formed on a conductive layer or a substrate (wafer) 100. The opening 104 includes via hole or contact window and the conductive layer or the substrate 100 is exposed.

Figure 3B:
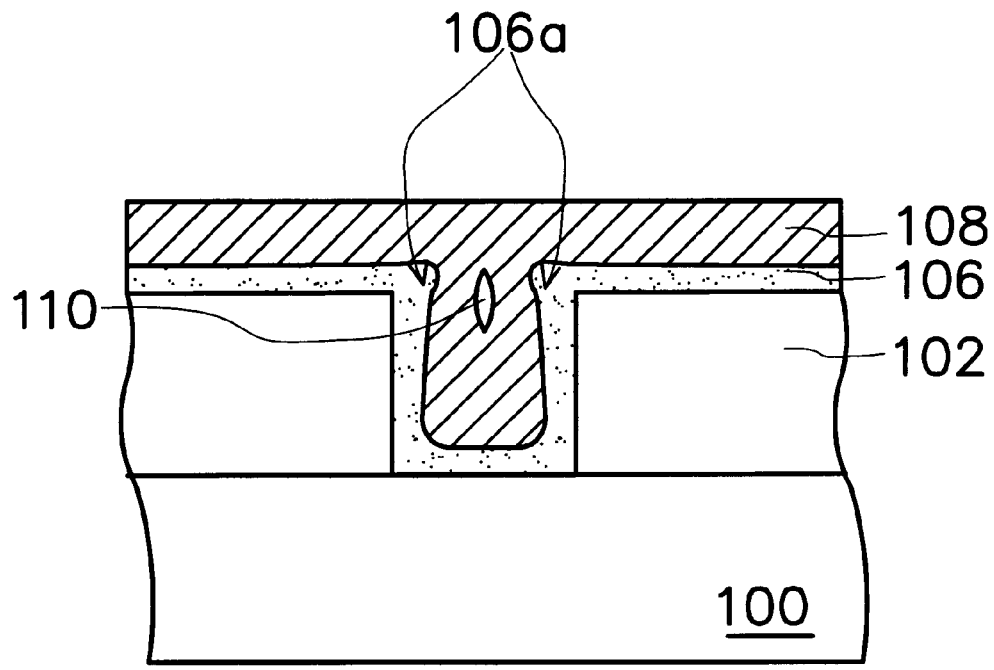

Referring to FIG. 3B, a conformal barrier layer 106 including titanium/titanium nitride or titanium nitride is formed on the dielectric layer 102. The barrier layer 106 is used to prevent from direct contact of plug subsequently and substrate/conductive layer 100, and enhance adhesion between the plug, the substrate/conductive layer 100 and the dielectric layer 102. A metal layer 108 such as tungsten is deposited on the barrier layer 106. Since an overhang structure 106a is formed on the upper corner of the barrier layer 106, it causes worse step coverage of layers subsequently. The metal layer 108 can not fill in the opening of FIG. 3A completely and as a result, a key hole 110 is formed within the metal layer 108.

Figure 3C:
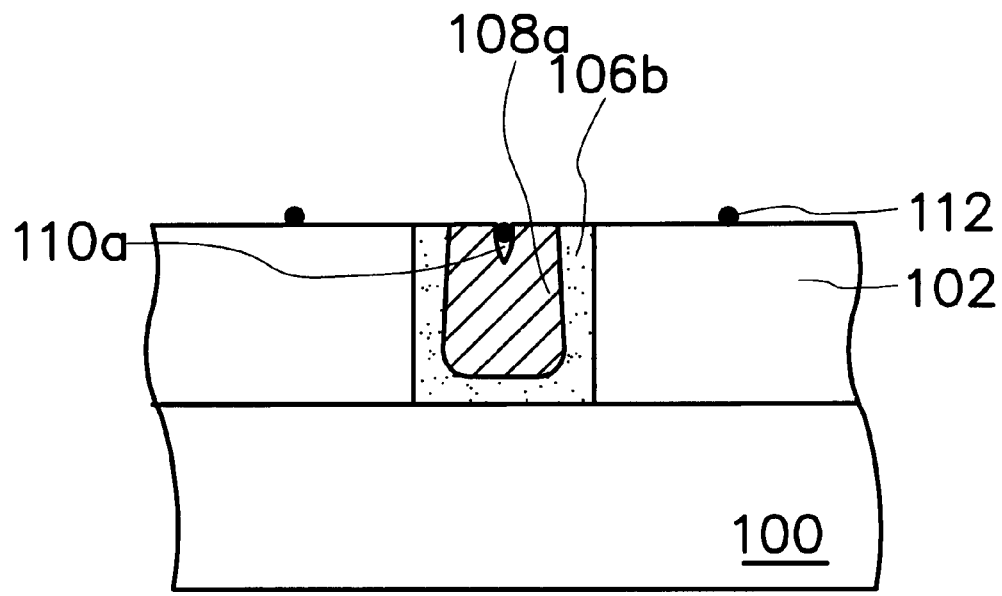

Referring to FIG. 3C, using the dielectric layer 102 as a stop layer, a portion of the metal layer 108 and the barrier layer 106 on the dielectric layer 102 are removed. CMP is performed to remove the metal layer 108 and the barrier layer 106. Colloidal silicate, dispersed alumina and ferric nitride ($Fe(NO_3)_3$), hydrogen peroxide ($H_2O_2$) or potassium iodate ($KIO_3$) are mixed together to serve a slurry of CMP. The slurry is pumped continuously into a polishing pad of a polishing table by a pipe. The particles with higher abrasive in the slurry are used to polish the metal layer 108 and the metal layer 106, and they can be removed by CMP. A metal layer 108 with a key hole 110 is removed in forgoing step and a dint 110a is formed from the key hole 108. As a result, the particles or slurry are not only left on the surface of the dielectric layer 102 but also left in the dint 110a.

Figure 3D:
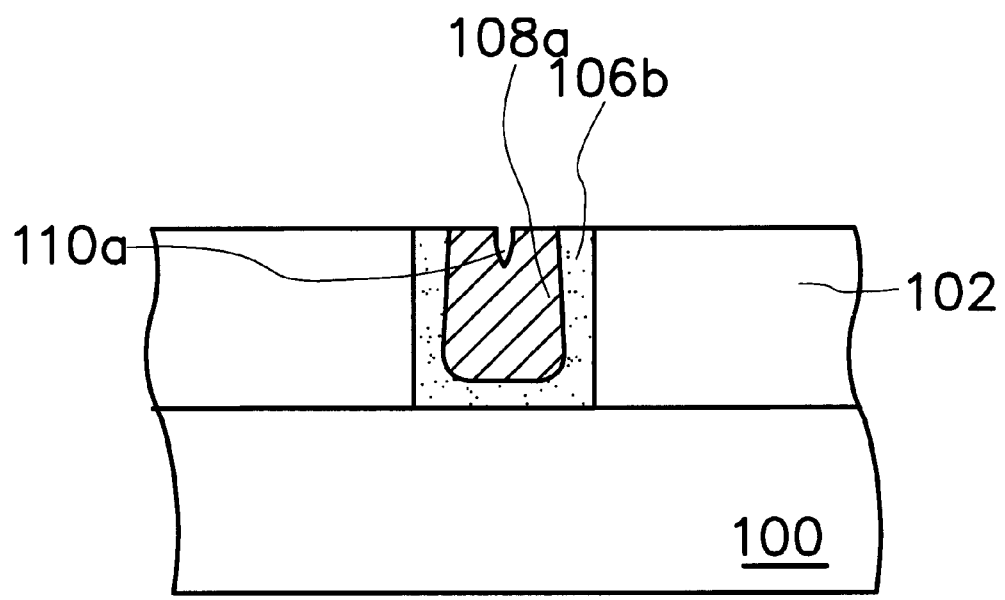
Figure 4:
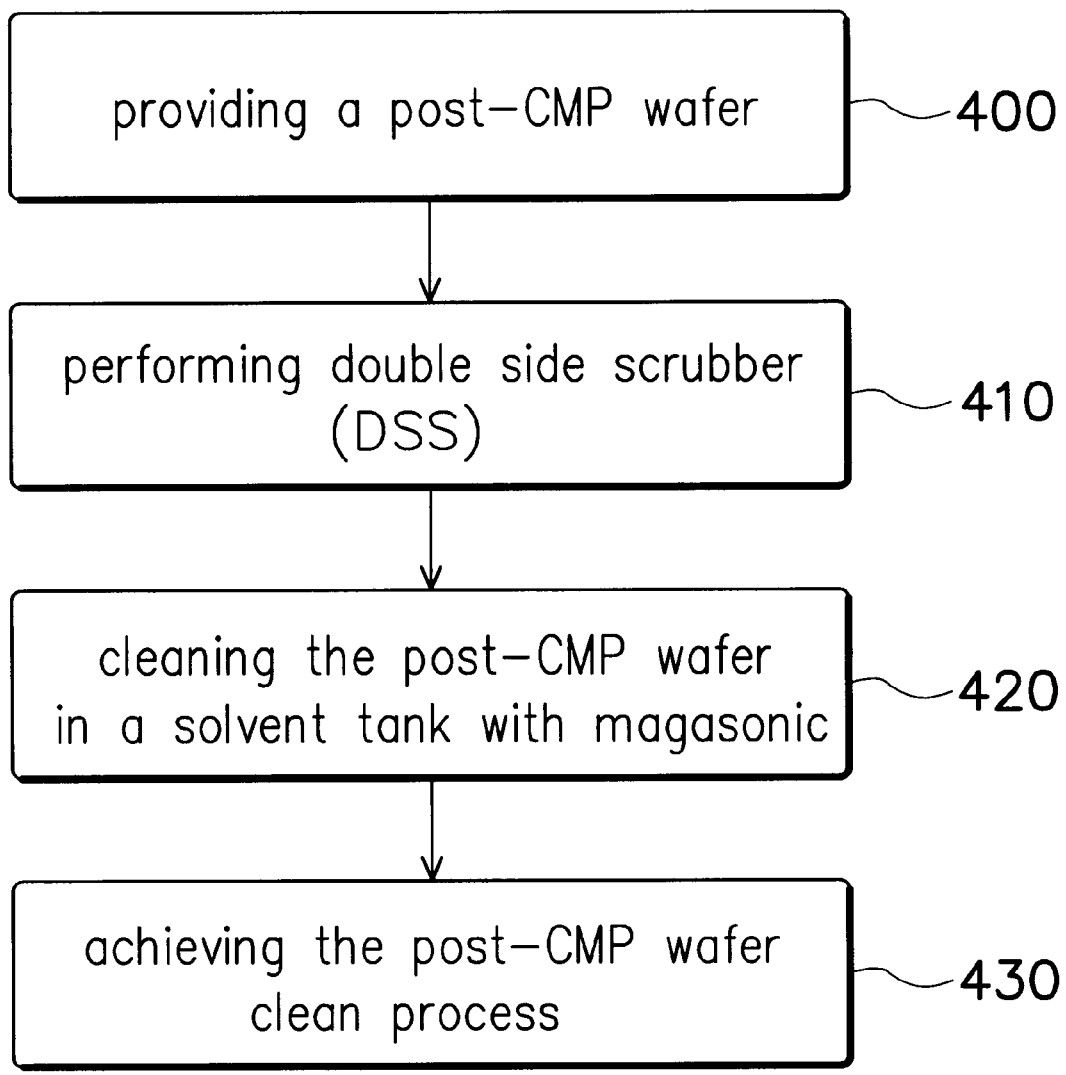
FIG. 4 is a flow chart of post-CMP clean process in the invention.

Referring to FIG. 3D, since the particles and slurry 112 absorb moisture easily, material layers can not be adhered on the dielectric layer 102 and the metal layer 108a. The moisture becomes vapor to form a bubble with the metal layer in subsequent process of a high temperature process. It causes poison of the metal layers and as a result, the performance of device becomes worse. A post-CMP wafer clean process is therefore provided and the process is described hereinafter, as shown in FIG. 4. The clean process of DSS of step 410 is used to remove the residual particles and slurry 112 from the dielectric layer 102 after providing a post-CMP wafer 400. The residual particles and slurry 112 are then removed with a special solvent by megasonic of step 420, such that the post-CMP clean wafer process is achieved.

DSS is a clean method that scrubs both side of wafer and $NH_4OH$ and dilute hydrogen fluoride are used as a scrubbing solution. The residual particles and slurry can be removed by DSS approximately. The frequency of megasonic in this invention is about $10^4$–$10^8$ Hz and the preferred solvent in the tank includes an amine-based compound, such as hydroxylamine and catechol or the likes. The particles and slurry 112 left on the dielectric layer 102 or dint 110a has zeta potential energy, so they need to have higher energy than zeta potential energy and the particles and slurry 112 can be removed completely from the dielectric layer 112 and the dint 110a. The megasonic with a frequency of about $10^4$–$10^8$ is provided and the particles and slurry have high enough energy to overcome the zeta potential energy. In the other hand, using the amine-based compound as a solvent, since the polar of the particles and slurry are closer to the solvent, the particles and slurry can be removed from the dielectric layer 102 and the dint 100a to achieve the object of cleaning the wafer 100.

As described above, the post-CMP wafer clean process in this invention has several advantages and described hereinafter:

(1) The post-CMP wafer clean process is performed in a tank with megasonic and a special solvent is added in the tank to enhance the ability of the clean process, such that the particles and slurry can be removed from the surface of the wafer. The material layers can be formed on the wafer easily.

(2) The post-CMP wafer clean process is performed in a tank with megasonic and a special solvent is added in the tank to remove the particles and slurry from the dint. Therefore short occurred on device due to crack of metal layers can be prevented. The reliability of the device is thus enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A post-CMP (chemical mechanical polishing) wafer clean method to clean a slurry on the wafer, the method comprising the steps of:

providing a post-CMP wafer, wherein a top surface of the post-CMP wafer includes a dielectric surface and a metal surface, in which the metal surface may include a dint resulting from a void in a previous depositing process; and cleaning the slurry and the particles on the post-CMP wafer by dipping the wafer in a solvent tank with megasonic at a frequency in the range of $10^4$–$10^8$ Hz frequency to overcome a zeta potential energy existing between the slurry and the top surface of the post-CMP wafer.

2. The method according to claim 1, wherein the megasonic frequency is in a range greater than 5 MHz and about less than 100 MHz.

3. The method according to claim 2, wherein a solvent in the solvent tank includes a hydroxylamine.

4. The method according to claim 1, wherein the solvent includes hydroxylamine and catechol.

5. A post-CMP (chemical mechanical polishing) wafer clean method to clean a slurry on the wafer after a CMP process, the method comprising the steps of:

providing a post-CMP wafer, wherein a top surface of the post-CMP wafer at least includes a dielectric surface and a metal surface, wherein the metal surface may include a dint resulting from a void in a previous depositing process;

performing a double side scrubber on the post-CMP wafer; and cleaning the slurry and the particles on the post-CMP wafer by dipping the wafer in a solvent tank with megasonic at a frequency in the range of $10^4$–$10^8$ Hz frequency to overcome a zeta potential energy existing between the slurry and the top surface of the post-CMP wafer.

6. The method according to claim 5, wherein the megasonic frequency is in a range about $10^5$–$10^7$ Hz.

7. The method according to claim 5, wherein a solvent in the solvent tank includes a hydroxylamine.

8. The method according to claim 5, wherein the solvent includes hydroxylamine and catechol.

9. The method according to claim 6, wherein a solvent in the solvent tank includes an amine-based compound.

10. The method according to claim 6, wherein the solvent includes hydroxylamine and catechol.

11. The method according to claim 6, wherein the megasonic frequency is in a range greater than 5 MHz and about less than 100 MHz.

12. A method for cleaning a slurry on a substrate, the method comprising the steps of:

providing a substrate which is polished by a CMP process, wherein a top surface of the substrate includes a dielectric surface and a metal surface, in which the metal surface may include a dint resulting from a void in a previous depositing process; and cleaning the slurry on the substrate by dipping the substrate in a solvent tank with a megasonic energy at a sufficiently high frequency to overcome a zeta potential energy existing between the slurry and the top surface of the substrate, wherein the frequency includes a range of about $10^6$–$10^8$ Hz, and the solvent includes and a mix of hydroxylamine and catechol.

13. The method according to claim 12, the method further includes a step of performing a double side scrubber on the substrate, before the step of cleaning the slurry on the substrate.

* * * * *